(12) United States Patent
Zhou et al.

(10) Patent No.: US 7,659,208 B2
(45) Date of Patent: Feb. 9, 2010

(54) METHOD FOR FORMING HIGH DENSITY PATTERNS

(75) Inventors: Baosuo Zhou, Boise, ID (US); Gurtej S. Sandhu, Boise, ID (US); Ardavan Niroomand, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 49 days.

(21) Appl. No.: 11/952,017

(22) Filed: Dec. 6, 2007

(65) Prior Publication Data
US 2009/0149026 A1 Jun. 11, 2009

(51) Int. Cl.
*H01L 21/311* (2006.01)
(52) U.S. Cl. ............... 438/700; 257/E21.626; 257/E21.627; 257/E21.64
(58) Field of Classification Search ........ 438/424, 438/706, 745, 637, 672, 700; 257/E21.626, 257/E21.627, E21.64, E21.641
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,716,131 A | 12/1987 | Okazawa et al. | |
| 4,776,922 A | 10/1988 | Bhatta charyya et al. | |
| 4,838,991 A | 6/1989 | Cote et al. | |
| 5,013,680 A | 5/1991 | Lowrey et al. | |

(Continued)

FOREIGN PATENT DOCUMENTS

DE 42 36 609 A1 5/1994

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner*—Quoc D Hoang
(74) *Attorney, Agent, or Firm*—Knobbe, Martens, Olson & Bear LLP

(57) ABSTRACT

Methods are disclosed, such as those involving increasing the density of isolated features in an integrated circuit. In one or more embodiments, a method is provided for forming an integrated circuit with a pattern of isolated features having a final density of isolated features that is greater than a starting density of isolated features in the integrated circuit by a multiple of two or more. The method can include forming a pattern of pillars having a density X, and forming a pattern of holes amongst the pillars, the holes having a density at least X. The pillars can be selectively removed to form a pattern of holes having a density at least 2X. In some embodiments, plugs can be formed in the pattern of holes, such as by epitaxial deposition on the substrate, in order to provide a pattern of pillars having a density 2X. In other embodiments, the pattern of holes can be transferred to the substrate by etching.

35 Claims, 13 Drawing Sheets

U.S. PATENT DOCUMENTS

| | | | |
|---|---|---|---|
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,470,661 A | 11/1995 | Bailey et al. | |
| 5,514,885 A | 5/1996 | Myrick | |
| 5,670,794 A | 9/1997 | Manning | |
| 5,753,546 A | 5/1998 | Koh et al. | |
| 5,789,320 A | 8/1998 | Andricacos et al. | |
| 5,795,830 A | 8/1998 | Cronin et al. | |
| 5,830,332 A | 11/1998 | Babich et al. | |
| 5,899,746 A | 5/1999 | Mukai | |
| 5,998,256 A | 12/1999 | Juengling | |
| 6,004,862 A | 12/1999 | Kim et al. | |
| 6,010,946 A | 1/2000 | Hisamune et al. | |
| 6,042,998 A | 3/2000 | Brueck et al. | |
| 6,057,573 A | 5/2000 | Kirsch et al. | |
| 6,063,688 A | 5/2000 | Doyle et al. | |
| 6,071,789 A | 6/2000 | Yang et al. | |
| 6,110,837 A | 8/2000 | Linliu et al. | |
| 6,143,476 A | 11/2000 | Ye et al. | |
| 6,211,044 B1 | 4/2001 | Xiang et al. | |
| 6,288,454 B1 | 9/2001 | Allman et al. | |
| 6,291,334 B1 | 9/2001 | Somekh | |
| 6,297,554 B1 | 10/2001 | Lin | |
| 6,335,257 B1 | 1/2002 | Tseng | |
| 6,348,380 B1 | 2/2002 | Weimer et al. | |
| 6,362,057 B1 | 3/2002 | Taylor, Jr. et al. | |
| 6,383,907 B1 | 5/2002 | Hasegawa et al. | |
| 6,395,613 B1 | 5/2002 | Juengling | |
| 6,423,474 B1 | 7/2002 | Holscher | |
| 6,455,372 B1 | 9/2002 | Weimer | |
| 6,514,884 B2 | 2/2003 | Maeda | |
| 6,522,584 B1 | 2/2003 | Chen et al. | |
| 6,534,243 B1 | 3/2003 | Templeton | |
| 6,548,396 B2 | 4/2003 | Naik et al. | |
| 6,559,017 B1 | 5/2003 | Brown et al. | |
| 6,566,280 B1 | 5/2003 | Meagley et al. | |
| 6,573,030 B1 | 6/2003 | Fairbairn et al. | |
| 6,602,779 B1 | 8/2003 | Li et al. | |
| 6,632,741 B1 | 10/2003 | Clevenger et al. | |
| 6,667,237 B1 | 12/2003 | Metzler | |
| 6,673,684 B1 | 1/2004 | Huang et al. | |
| 6,686,245 B1 | 2/2004 | Mathew et al. | |
| 6,689,695 B1 | 2/2004 | Lui et al. | |
| 6,706,571 B1 | 3/2004 | Yu et al. | |
| 6,709,807 B2 | 3/2004 | Hallock et al. | |
| 6,734,107 B2 | 5/2004 | Lai et al. | |
| 6,744,094 B2 | 6/2004 | Forbes | |
| 6,773,998 B1 | 8/2004 | Fisher et al. | |
| 6,835,662 B1 | 12/2004 | Erhardt et al. | |
| 6,867,116 B1 | 3/2005 | Chung | |
| 6,875,703 B1 | 4/2005 | Furukawa et al. | |
| 6,893,972 B2 | 5/2005 | Rottstegge et al. | |
| 6,924,191 B2 | 8/2005 | Liu et al. | |
| 6,962,867 B2 | 11/2005 | Jackson et al. | |
| 7,015,124 B1 | 3/2006 | Fisher et al. | |
| 7,074,668 B1 | 7/2006 | Park et al. | |
| 7,183,205 B2 | 2/2007 | Hong | |
| 7,183,597 B2 | 2/2007 | Doyle | |
| 7,208,379 B2 | 4/2007 | Venugopal et al. | |
| 7,288,445 B2 | 10/2007 | Bryant et al. | |
| 7,291,560 B2 | 11/2007 | Parascandola et al. | |
| 7,393,789 B2 * | 7/2008 | Abatchev et al. | 438/692 |
| 7,456,458 B2 * | 11/2008 | Wang | 257/296 |
| 2002/0042198 A1 | 4/2002 | Bjarnason et al. | |
| 2002/0045308 A1 | 4/2002 | Juengling | |
| 2002/0063110 A1 | 5/2002 | Cantell et al. | |
| 2002/0068243 A1 | 6/2002 | Hwang et al. | |
| 2002/0127810 A1 | 9/2002 | Nakamura et al. | |
| 2003/0006410 A1 | 1/2003 | Doyle | |
| 2003/0044722 A1 | 3/2003 | Hsu et al. | |
| 2003/0109102 A1 | 6/2003 | Kujirai et al. | |
| 2003/0119307 A1 | 6/2003 | Bekiaris et al. | |
| 2003/0127426 A1 | 7/2003 | Chang et al. | |
| 2003/0157436 A1 | 8/2003 | Manger et al. | |
| 2003/0207207 A1 | 11/2003 | Li | |
| 2003/0207584 A1 | 11/2003 | Sivakumar et al. | |
| 2003/0216050 A1 | 11/2003 | Golz et al. | |
| 2003/0230234 A1 | 12/2003 | Nam et al. | |
| 2004/0000534 A1 | 1/2004 | Lipinski | |
| 2004/0017989 A1 | 1/2004 | So | |
| 2004/0018738 A1 | 1/2004 | Liu | |
| 2004/0023475 A1 | 2/2004 | Bonser et al. | |
| 2004/0023502 A1 | 2/2004 | Tzou et al. | |
| 2004/0043623 A1 | 3/2004 | Liu et al. | |
| 2004/0053475 A1 | 3/2004 | Sharma | |
| 2004/0079988 A1 | 4/2004 | Harari | |
| 2004/0106257 A1 | 6/2004 | Okamura et al. | |
| 2004/0235255 A1 | 11/2004 | Tanaka et al. | |
| 2005/0074949 A1 | 4/2005 | Jung et al. | |
| 2005/0112886 A1 | 5/2005 | Asakawa et al. | |
| 2005/0142497 A1 | 6/2005 | Ryou | |
| 2005/0153562 A1 | 7/2005 | Furukawa et al. | |
| 2005/0167394 A1 | 8/2005 | Liu et al. | |
| 2005/0186705 A1 | 8/2005 | Jackson et al. | |
| 2005/0272259 A1 | 12/2005 | Hong | |
| 2006/0003182 A1 | 1/2006 | Lane et al. | |
| 2006/0024940 A1 | 2/2006 | Furukawa et al. | |
| 2006/0024945 A1 | 2/2006 | Kim et al. | |
| 2006/0046161 A1 | 3/2006 | Yin et al. | |
| 2006/0046200 A1 | 3/2006 | Abatchev et al. | |
| 2006/0046201 A1 | 3/2006 | Sandhu et al. | |
| 2006/0046422 A1 | 3/2006 | Tran et al. | |
| 2006/0046484 A1 | 3/2006 | Abatchev et al. | |
| 2006/0083996 A1 | 4/2006 | Kim | |
| 2006/0172540 A1 | 8/2006 | Marks et al. | |
| 2006/0189150 A1 | 8/2006 | Jung | |
| 2006/0211260 A1 | 9/2006 | Tran et al. | |
| 2006/0216923 A1 | 9/2006 | Tran et al. | |
| 2006/0231900 A1 | 10/2006 | Lee et al. | |
| 2006/0263699 A1 | 11/2006 | Abatchev et al. | |
| 2006/0267075 A1 | 11/2006 | Sandhu et al. | |
| 2006/0273456 A1 | 12/2006 | Sant et al. | |
| 2006/0281266 A1 | 12/2006 | Wells | |
| 2007/0018345 A1 | 1/2007 | Chao | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bai et al. | |
| 2007/0050748 A1 | 3/2007 | Juengling | |
| 2007/0210449 A1 | 9/2007 | Caspary et al. | |
| 2007/0215960 A1 | 9/2007 | Zhu et al. | |
| 2007/0275309 A1 | 11/2007 | Liu | |
| 2008/0054350 A1 * | 3/2008 | Breitwisch et al. | 257/330 |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| KR | 1999-0001440 | 1/1999 |
| KR | 1999-027887 | 4/1999 |
| WO | WO 94/15261 | 7/1994 |
| WO | WO 02/099864 A1 | 12/2002 |
| WO | WO 2004/001799 A2 | 12/2003 |
| WO | WO 2004/003977 A2 | 1/2004 |

| | | | |
|---|---|---|---|
| WO | WO 2005/034215 A1 | 4/2005 | |
| WO | WO 2006/026699 A2 | 3/2006 | |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Choi et al., "Sublithographic nanofabrication technology for nanocatalysts and DNA chips," J. Vac. Sci. Technol., Nov./Dec. 2003, pp. 2951-2955.

Chung et al., "Pattern multiplication method and the uniformity of nanoscale multiple lines*," J.Vac.Sci.Technol. B21(4), Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

"U.S. Appl. No. 11/543,515, filed Oct. 24, 2006."

Ex Parte Cantell, unpublished decision of the Board of Patent Appeals and Interferences, Mar. 4, 2005.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectic materials by high-density plasma etching," Solid State Tech., May 2000, 8 pages.

PCT International Search Report and Written Opinion issued Apr. 13, 2009, Int'l Appl. No. PCT/US2008/081474, filed Oct. 28, 2008.

Bruek, "Optical and interferometric lithography—Nanotechnology enablers," Proceedings of the IEEE, 2005, pp. 1704-1721, vol. 93, No. 10.

Sheats et al., "Microlithography: Science and technology," Marcel Dekkar, Inc., pp. 104-105, 1998.

Office Action dated Jun. 2, 2008 in U.S. Appl. No. 11/219,067, filed Jul. 24, 2006.

Office Action dated Jun. 5, 2008 in U.S. Appl. No. 11/514,117, filed Aug. 30, 2006.

Office Action dated Jul. 11, 2008 in U.S. Appl. No. 11/367,020, filed Mar. 2, 2006.

* cited by examiner

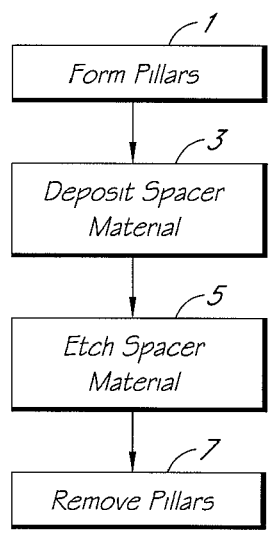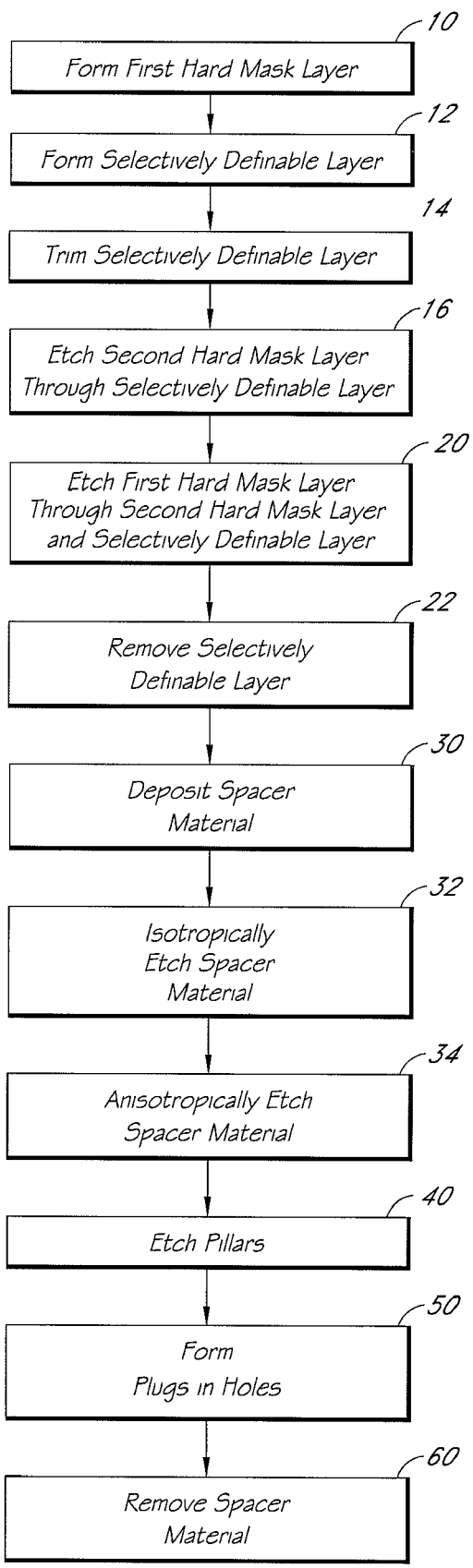
FIG. 1A
FIG. 1B

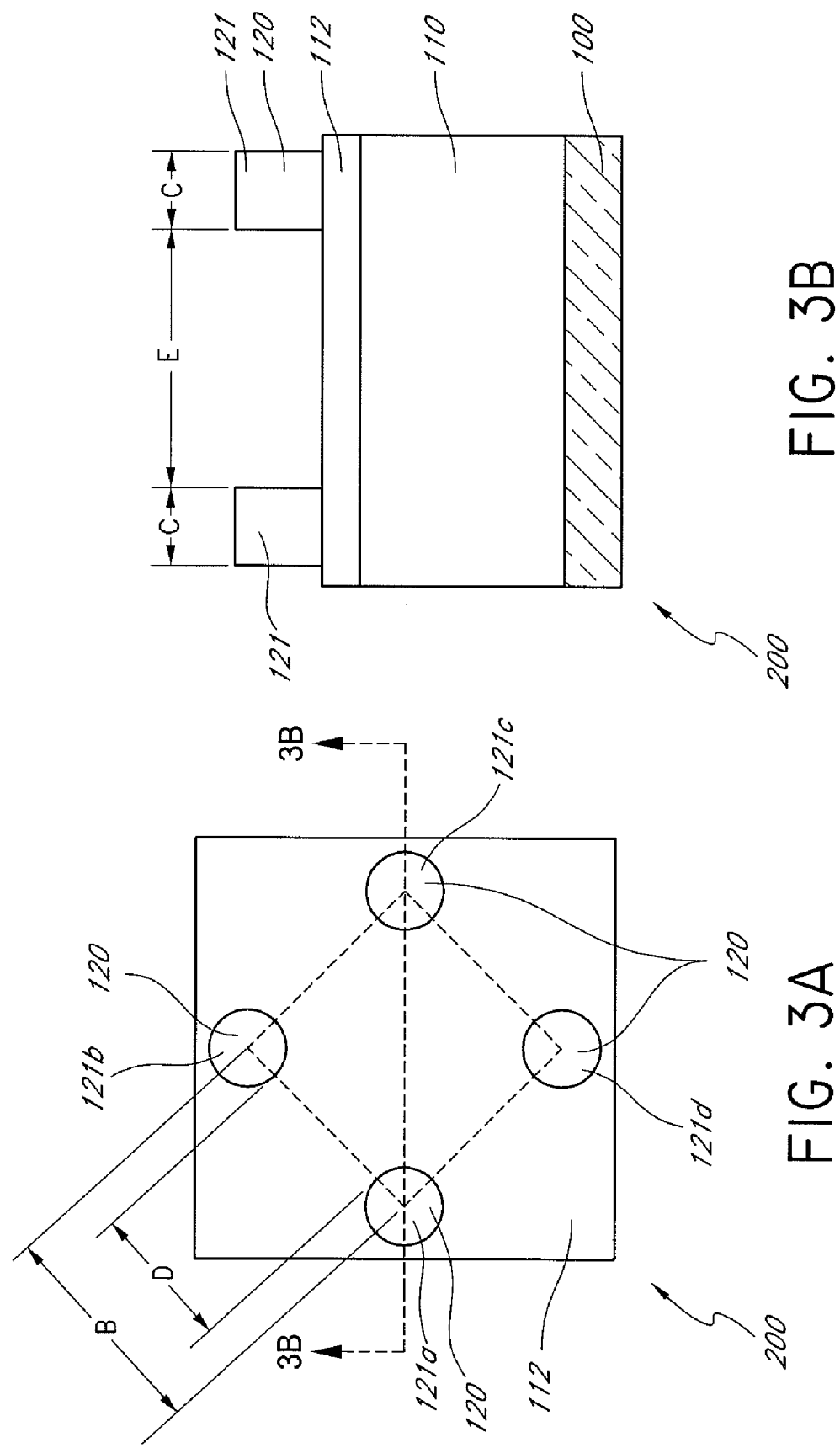

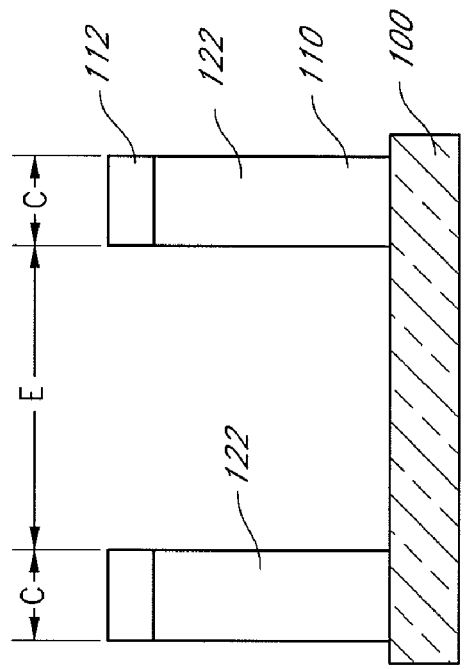
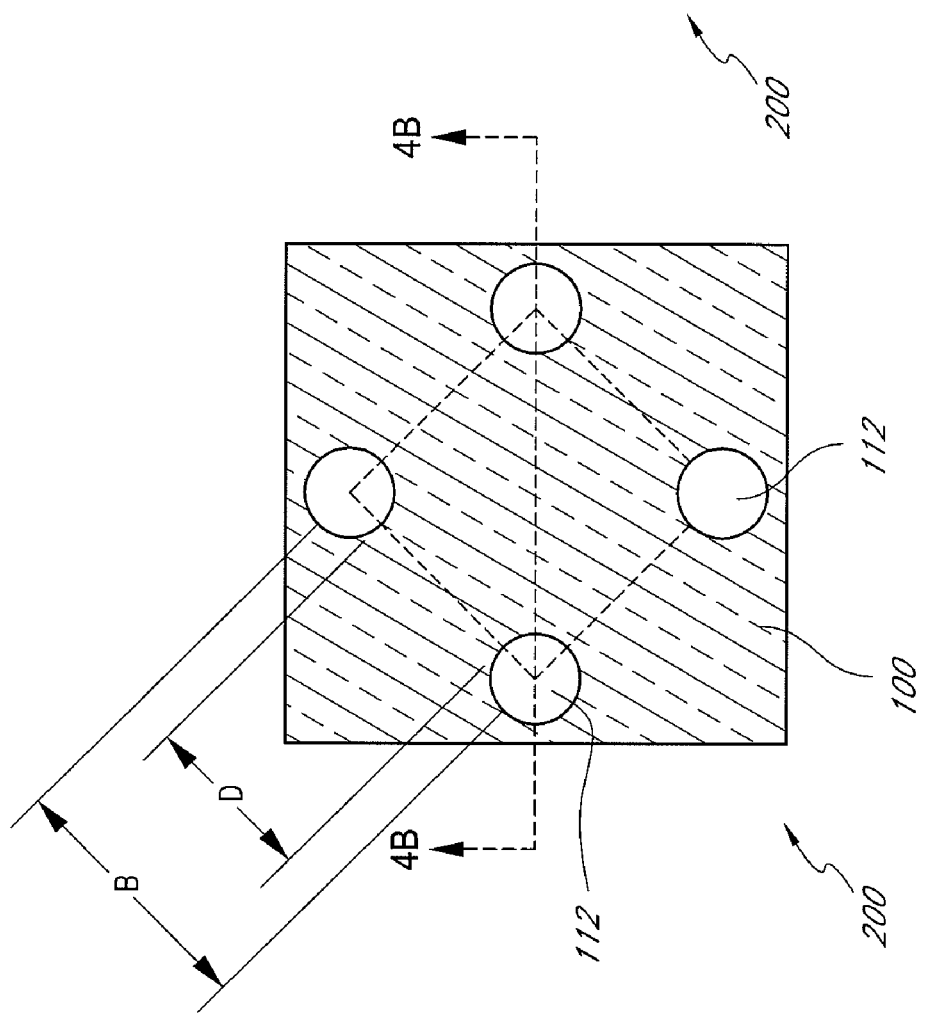
FIG. 4B
FIG. 4A

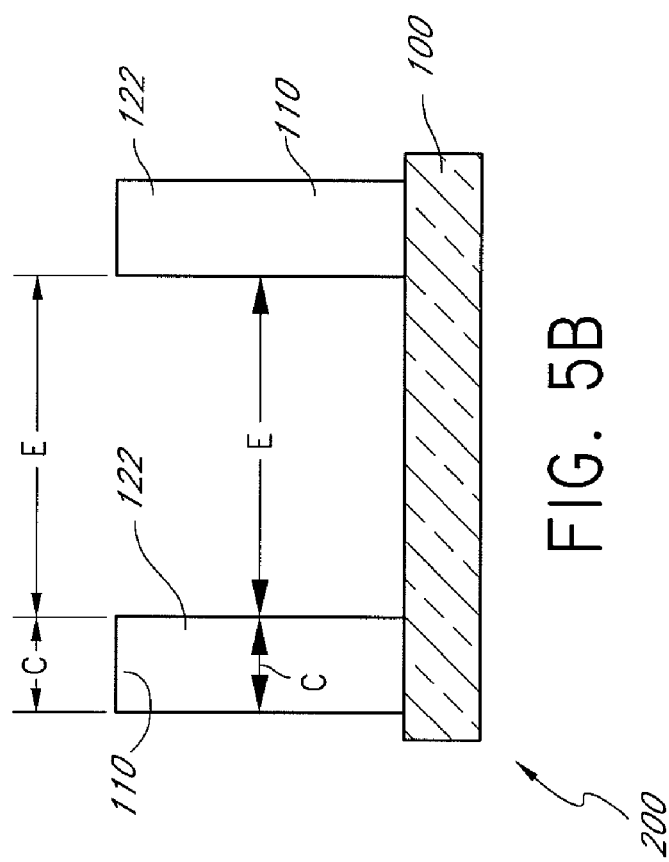
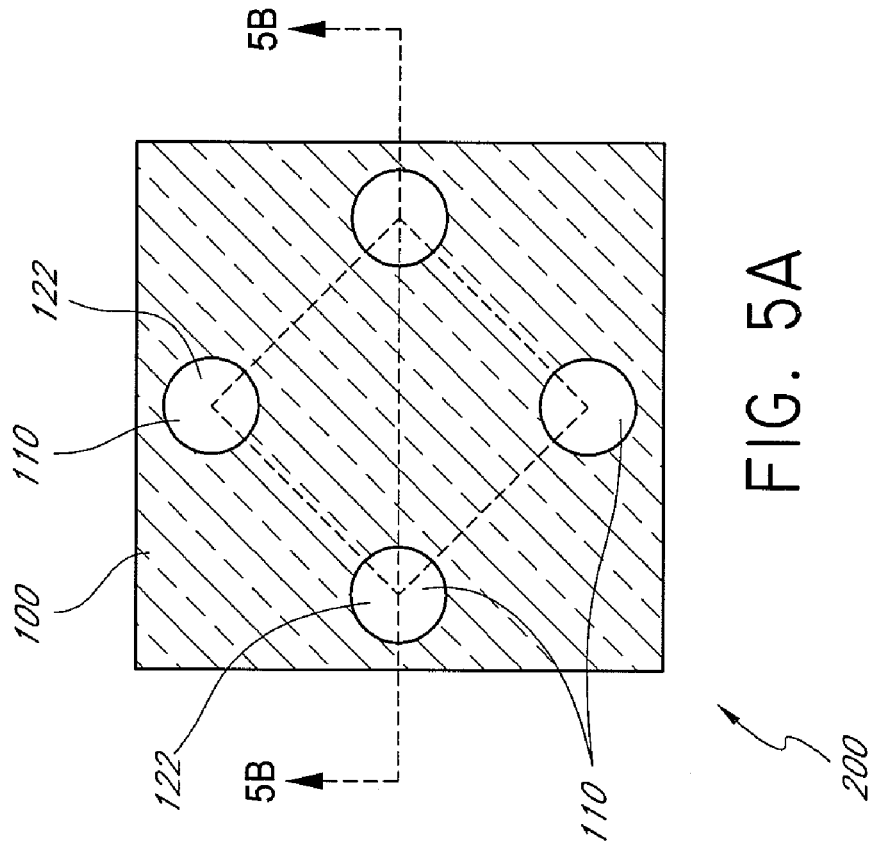

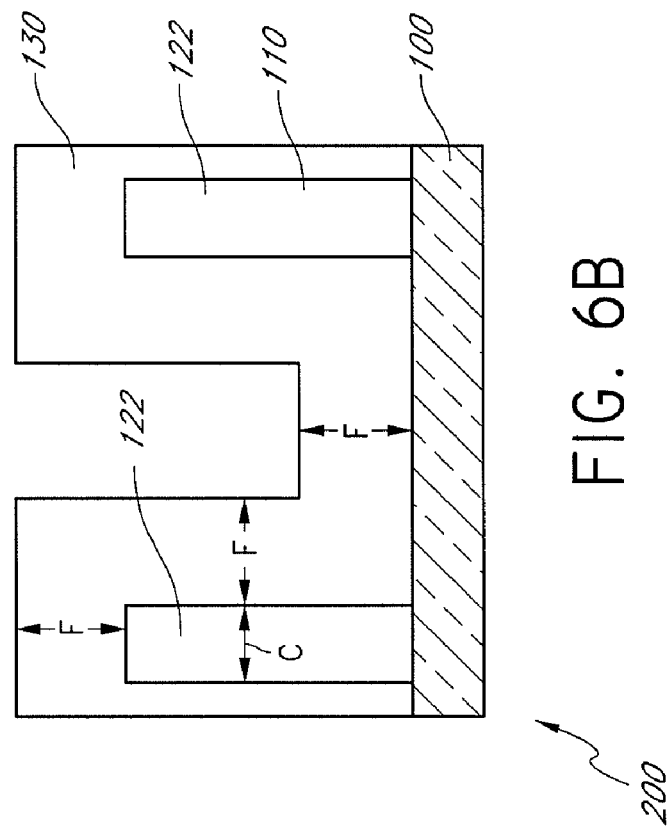
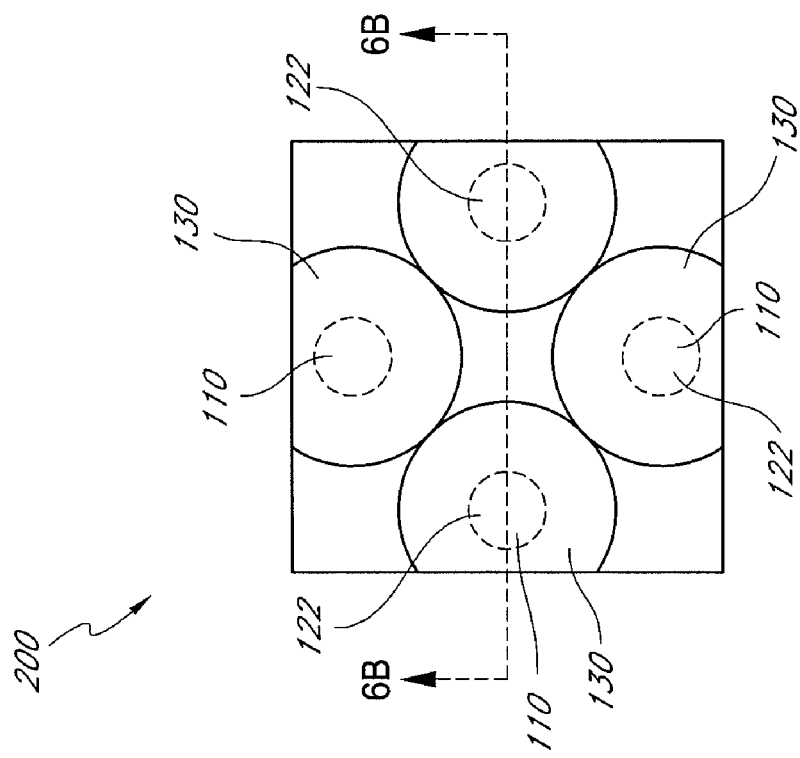
FIG. 6B
FIG. 6A

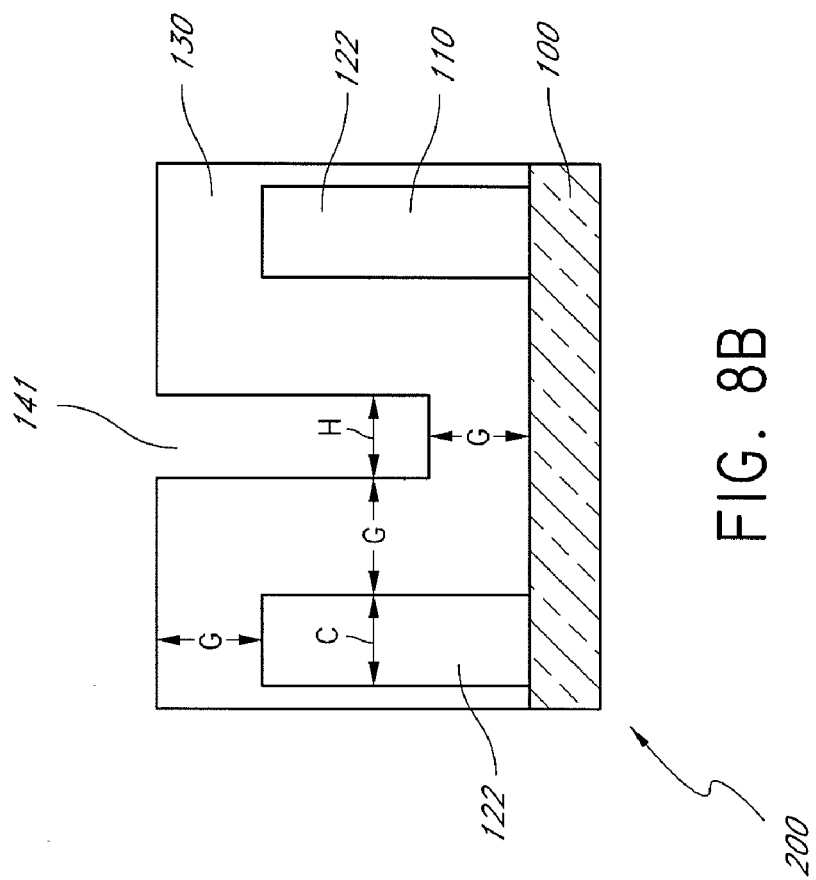
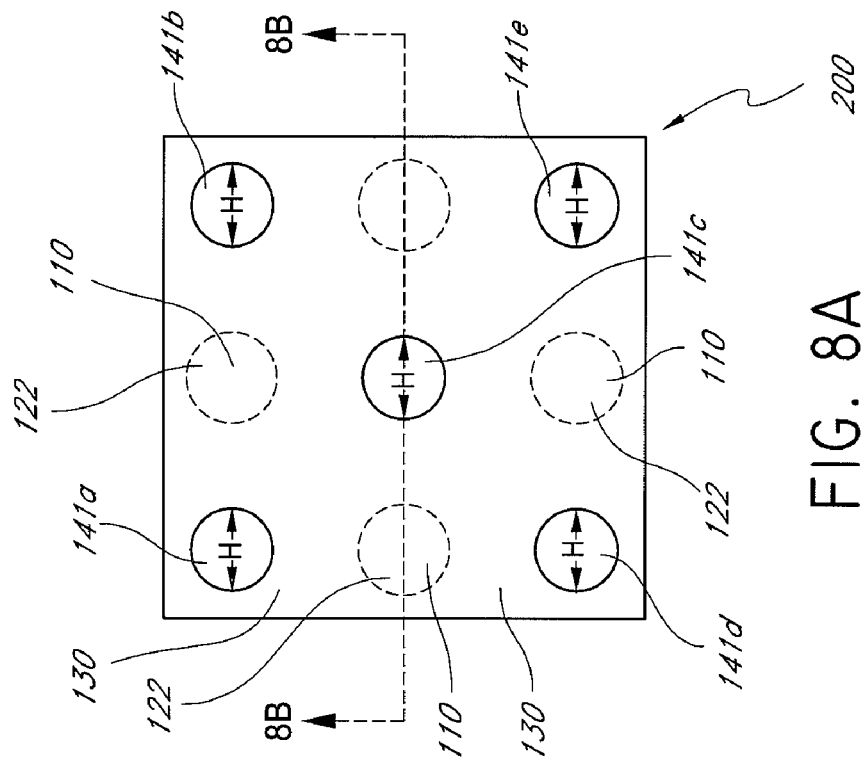
FIG. 8B
FIG. 8A

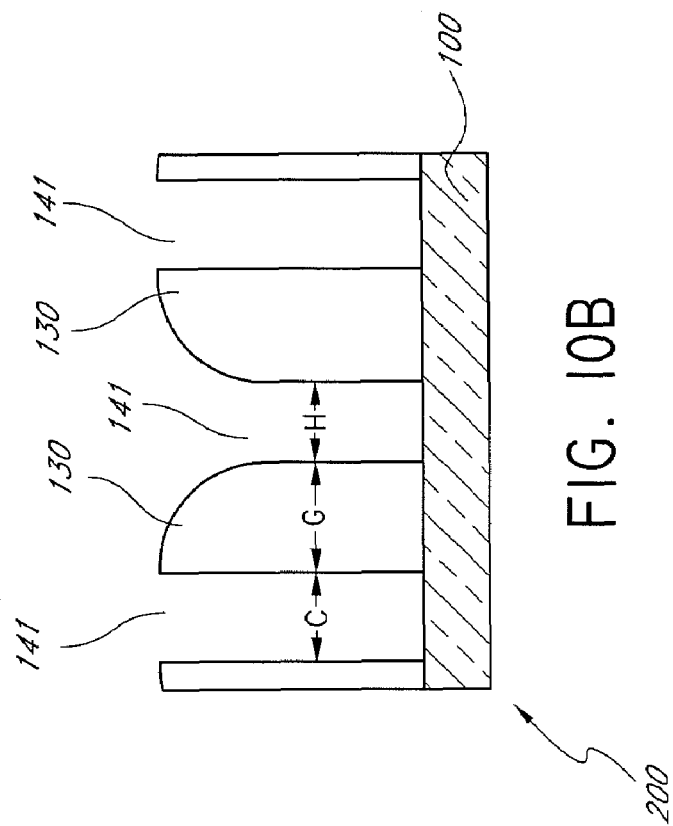
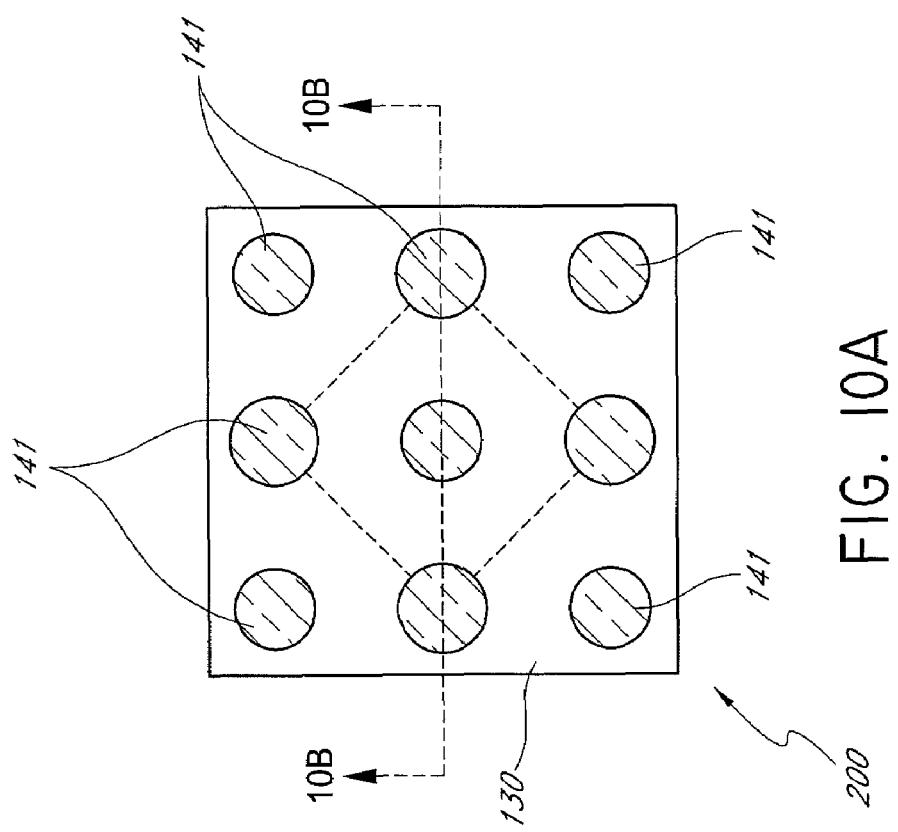
FIG. 10B
FIG. 10A

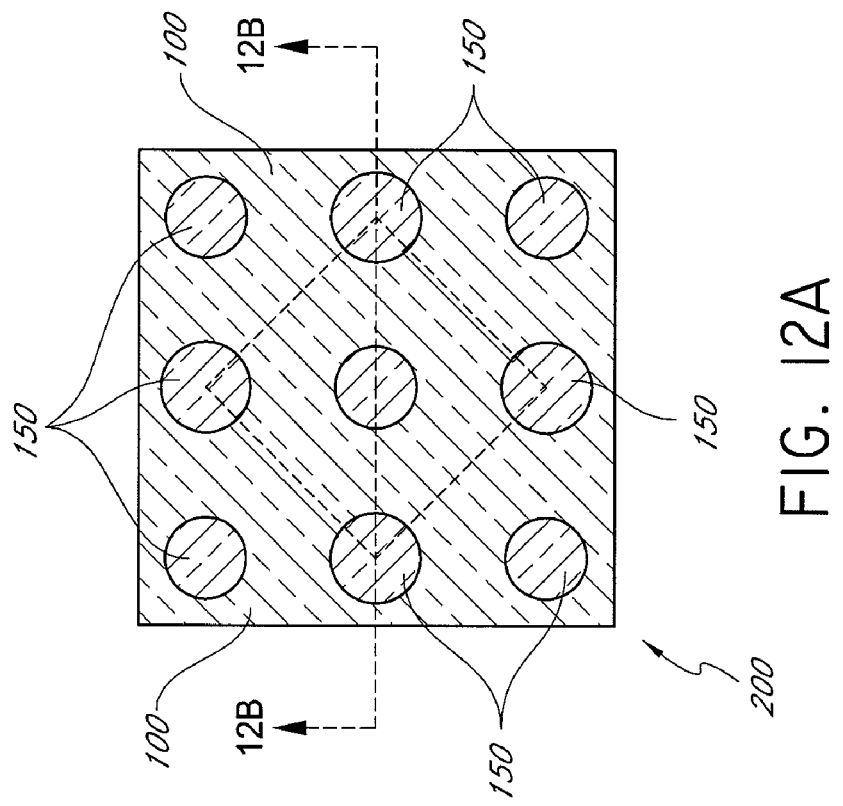
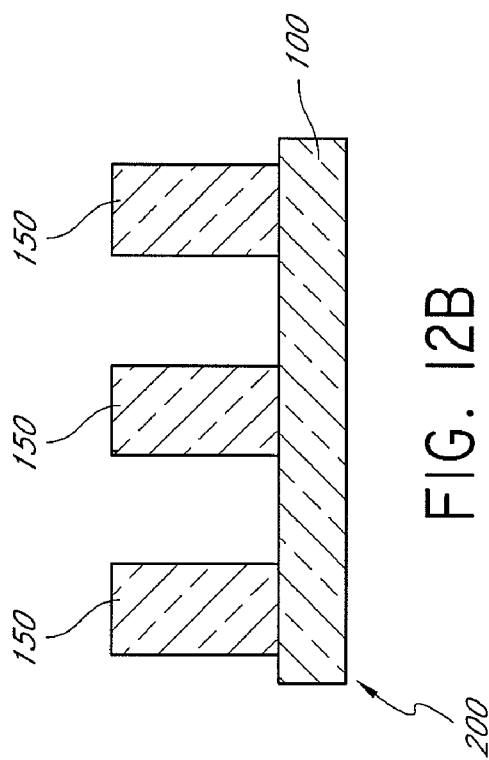

US 7,659,208 B2

METHOD FOR FORMING HIGH DENSITY PATTERNS

BACKGROUND OF THE INVENTION

1. Field of the Invention

Embodiments of the invention relate to semiconductor processing, and more particularly to masking techniques.

2. Description of the Related Art

There is a constant demand for faster and smaller integrated circuits, faster and smaller integrated circuits may be made by reducing the sizes and separation distances between the individual elements or electronic devices forming an integrated circuit. This process of increasing the density of circuit elements across a substrate is typically referred to as "scaling." As a result of the demand for faster and smaller integrated circuits, there is a constant need for methods of scaling to form isolated features with a high density.

BRIEF DESCRIPTION OF THE DRAWINGS

The appended drawings are schematic, not necessarily drawn to scale, and are meant to illustrate and not to limit embodiments of the invention.

FIG. 1A is a flow chart illustrating a process in accordance with one or more embodiments of the invention.

FIG. 1B is another flow chart illustrating a process in accordance with one or more embodiments of the invention.

FIG. 3A illustrates a top view of the partially formed integrated circuit of FIG. 2A after the pattern of pillars has been trimmed in accordance with one or more embodiments of the invention.

FIG. 3B illustrates a cross-sectional side view of the partially formed integrated circuit of FIG. 3A along the sectional line 3B shown in FIG. 3A.

FIG. 4A illustrates a top view of the partially formed integrated circuit of FIG. 3A after transferring the pattern of pillars to underlying masking layers in accordance with one or more embodiments of the invention.

FIG. 4B illustrates a cross-sectional side view of the partially formed integrated circuit of FIG. 4A along the sectional line 4B shown in FIG. 4A.

FIG. 5A illustrates a top view of the partially formed integrated circuit of FIG. 4A after one of the masking layers has been removed in accordance with one or more embodiments of the invention.

FIG. 5B illustrates a cross-sectional side view of the partially formed integrated circuit of FIG. 5A along the sectional line 5B shown in FIG. 5A.

FIG. 6A illustrates a top view of the partially formed integrated circuit of FIG. 5A during deposition of a spacer material on pillars in accordance with one or more embodiments of the invention.

FIG. 6B illustrates a cross-sectional side view of the partially formed integrated circuit of FIG. 6A along the sectional line 6B shown in FIG. 6A.

FIG. 8A illustrates a top view of the partially formed integrated circuit of FIG. 7A after etching the spacer material in accordance with one or more embodiments of the invention.

FIG. 8B illustrates a cross-sectional side view of the partially formed integrated circuit of FIG. 8A along the sectional line 8B shown in FIG. 8A.

FIG. 10A illustrates a top view of the partially formed integrated circuit of FIG. 9A after etching the pillars in accordance with one or more embodiments of the invention.

FIG. 10B illustrates a cross-sectional side view of the partially formed integrated circuit of FIG. 10A along the sectional line 10B shown in FIG. 10A.

FIG. 12A illustrates a top view of the partially formed integrated circuit of FIG. 11A after removing the spacer material in accordance with one or more embodiments of the invention.

FIG. 12B illustrates a cross-sectional side view of the partially formed integrated circuit of FIG. 12A along the sectional line 12B shown in FIG. 12A.

DETAILED DESCRIPTION OF THE PREFERRED EMBODIMENT

Embodiments described herein provide methods of forming patterns of isolated features having a high density. In one or more embodiments, a method is provided for forming an integrated circuit with a pattern of features having a final density of features that is greater than a starting density of features in the integrated circuit by a multiple of two or more. The method can include forming a pattern of isolated pillars having a density X. The method can further include forming spacers around the pillars, such as by blanket depositing spacer material on and around the pillars and then isotropically etching the spacer materials to form a pattern of holes having a density at least about X. The pillars can be selectively removed to form a mask with a pattern of holes having a density at least about 2X. In some embodiments, plugs can be formed in the pattern of holes in the mask, such as by epitaxial deposition on the substrate, in order to provide a pattern of pillars having a density at least 2X. In other embodiments, the pattern of holes in the mask can be etched into the substrate to provide a pattern of holes in the substrate.

Reference will now be made to the figures, in which like numerals refer to like parts throughout.

FIG. 1A illustrates a general sequence of process steps according to some embodiments of the invention. In step 1 of FIG. 1A, a plurality of pillars are formed on a substrate, such as by etching into a layer or stack of layers formed over the substrate or by forming material over a substrate in a pattern that defines a plurality of pillars. For example, the pillars can be formed by photolithography, by selectively exposing photoresist to light and then developing the photoresist to leave a pattern of pillars formed by the photoresist. As used herein, "forming" a structure includes performing steps to make the structure or providing the structure already premade. In step 3, spacer material is formed on and around the pillars to fill spaces between the pillars while leaving a pattern of openings between the pillars. In step 5, the spacer material is etched to form a pattern of holes completely open to an underlying material, the holes having a density at least as great as the density of the pattern of pillars. In step 7, the pillars are removed to form further holes, thus providing a pattern of holes with a density at least twice as great as the pattern of pillars that were previously formed on the substrate.

Figure 2:
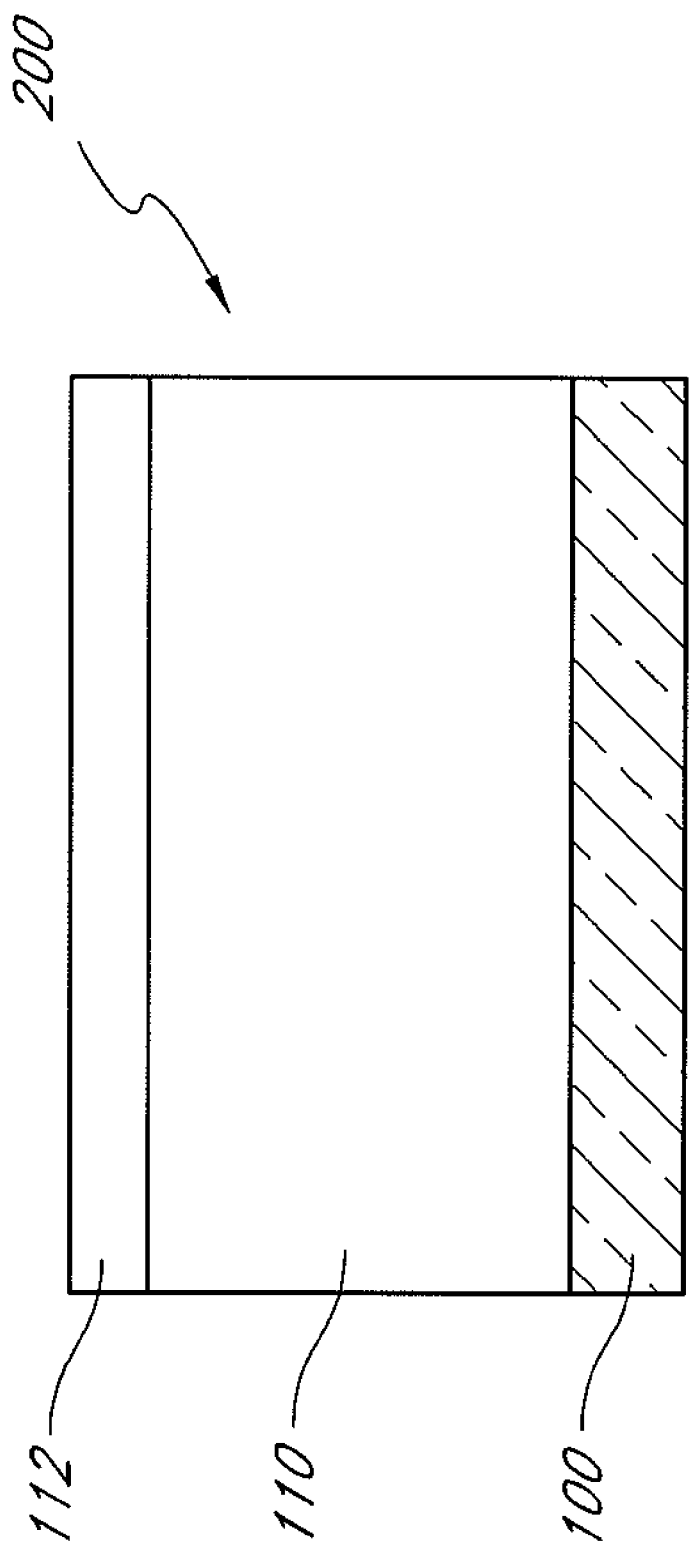
FIG. 2 illustrates a cross-sectional side view of a partially formed integrated circuit in accordance with one or more embodiments of the invention.

FIGS. 1B-12B illustrate schematically a detailed sequence of process steps according to some embodiments of the invention. In step 10, a substrate 100 is provided and a first hard mask layer 110 is formed thereover. (FIG. 2 illustrates a partially formed integrated circuit 200 after step 12 has been carried out.) The substrate 100 may include one or more of a variety of suitable workpieces for semiconductor processing. For example, the substrate can include a silicon wafer. In one or more embodiments, the first hard mask layer 110 includes amorphous carbon, e.g., transparent carbon, which has been found to have excellent etch selectivity with other materials of the illustrated imaging or masking stack. Methods for forming amorphous carbon are disclosed in A. Helmbold, D. Meissner, Thin Solid Films, 283 (1996) 196-203 and U.S. Patent Application Publication No. 2006/0211260, published Sep. 21, 2006, entitled "PITCH REDUCED PATTERNS RELATIVE TO PHOTOLITHOGRAPHY FEATURES," the entire disclosures of which are hereby incorporated herein by reference. In the illustrated embodiment, a second hard mask layer 112 is also formed over the first hard mask layer 110 to protect the first hard mask layer 110 during etching in later steps and/or to enhance the accuracy of forming patterns by photolithography. In one or more embodiments, the second hard mask layer 112 includes an anti-reflective coating (ARC), such as DARC or BARC/DARC, which can facilitate photolithography by preventing undesired light reflections.

Figures 2A, 2B:
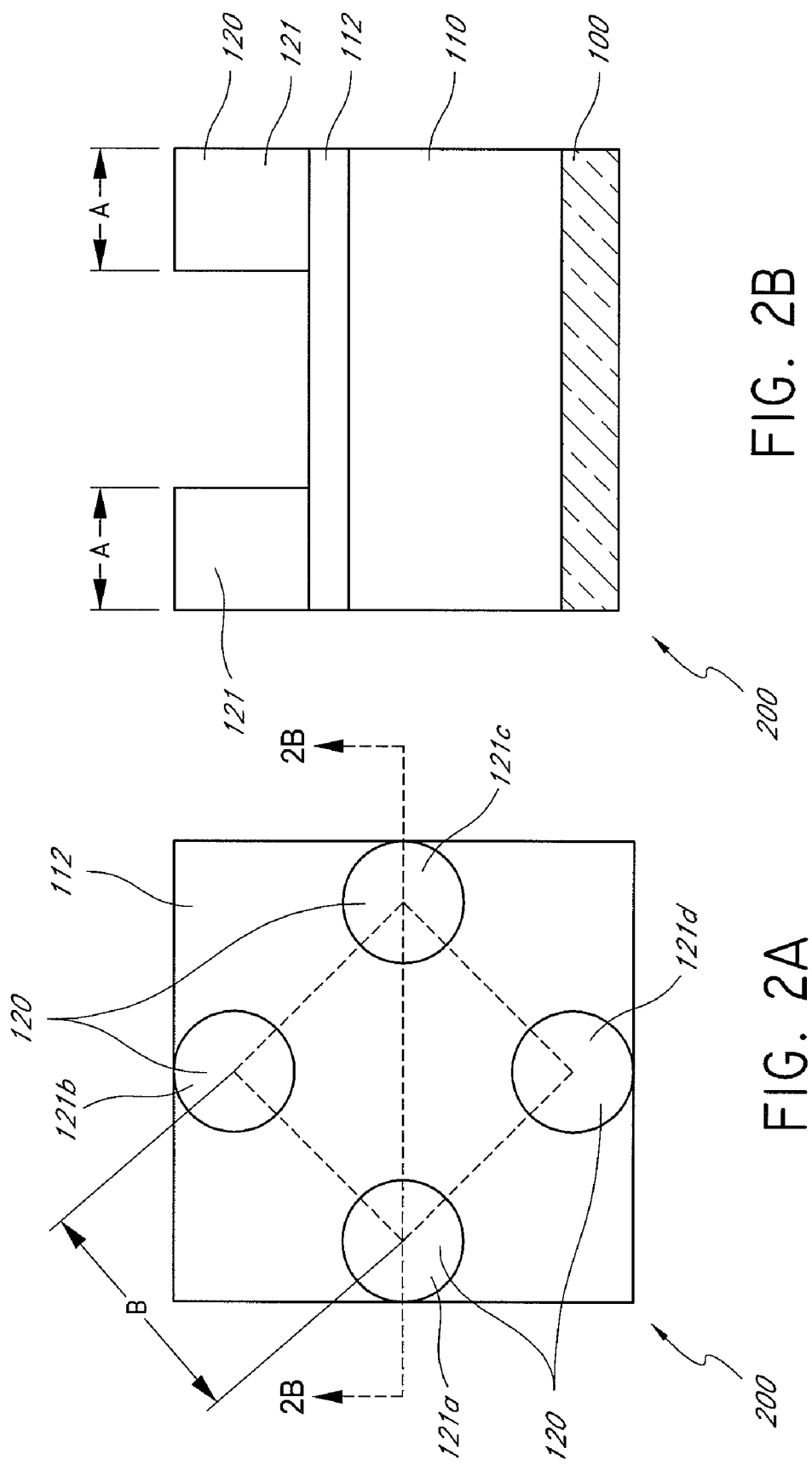
FIG. 2A illustrates a top view of a partially formed integrated circuit in accordance with one or more embodiments of the invention.
FIG. 2B illustrates a cross-sectional side view of the partially formed integrated circuit of FIG. 2A along the sectional line 2B shown in FIG. 2A.

In step 12, a selectively definable layer 120 is formed on the second hard mask layer 112. The selectively definable layer 120 can be formed using a photoresist in accordance with well-known processes for providing masks in semiconductor fabrication. For example, the photoresist can be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, can be used to define the selectively definable layer 120. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the selectively definable layer 120 and any subsequent resist layers can be formed of a resist that can be patterned by nano-imprint lithography, e.g., by using a mold or mechanical force to pattern the resist. FIGS. 2A and 2B illustrate a partially formed integrated circuit 200 after step 12 has been carried out. As shown in FIGS. 2A and 2B, the selectively definable layer 120 can include a mask pattern, the pattern including a plurality of pillars 121 having a substantially circular cross-section. The width of the pillars 121 in the selectively definable layer 120 is A. The pillars 121 can be patterned using a photolithographic technique. In one or more embodiments, A can be substantially equal to the minimum feature size formable using the lithographic techniques. In other embodiments, the pillars 121 can be formed with width A larger than the minimum formable feature size formed by photolithography and subsequently trimmed, in order to enhance the accuracy of the patterns formed by photolithography. It will be appreciated that photolithographic techniques typically can more easily and accurately form features having sizes above the size limit of the technique.

As shown in FIG. 2A, the distance between centers of nearest neighboring pillars 121, such as between pillars 121a and 121b, is B. In the illustrated embodiment, B is substantially equal to twice the width A, which has advantages for forming a pattern of holes arranged in rows and columns as described herein. In embodiments where the width A is greater than one half of the distance B, the pillars 121 of the selectively definable layer 120 are trimmed during the trimming step 14 in order to achieve the dimensions C, D, and E as described hereinbelow. Although the mask pattern shown in FIGS. 2A and 2B includes pillars 121 with their centers located at the corner points of a square, other patterns are also possible, as will be described more fully hereinbelow.

FIGS. 3A and 3B illustrate the partially formed integrated circuit 200 after step 14 of FIG. 1B has been carried out. In step 14, the selectively definable layer 120 is trimmed, such as by subjecting the selectively definable layer 120 to $O_2/Cl_2$ or $O_2/HBr$ plasma. FIG. 3B shows that after the trimming step 14, the pillars 121 of the selectively definable layer 120 have a width C, which is less than the width A. Thus, the trimming step 14 can advantageously provide a feature size that is less than the minimum feature size formable using the lithographic technique used to pattern the selectively definable layer 120. In one or more embodiments, the width C is substantially equal to $$\left(\frac{\sqrt{2}}{2}\right)Y.$$

FIG. 3B also shows that after the trimming step 14, the distance between two distant pillars 121 of the selectively definable layer 120, such as between pillars 121a and 121c, is E. In one or more embodiments, the distance E is substantially equal to $$\left(\frac{3\sqrt{2}}{2}\right)Y.$$

FIG. 3A shows that after the trimming step 14, the distance between neighboring pillars 121 of the selectively definable layer 120, such as between pillars 121a and 121b, is D. In one or more embodiments, the distance D is substantially equal to $$\left(2-\left(\frac{\sqrt{2}}{2}\right)\right)Y.$$

Y is used herein as a multiplier having a dimension of distance to clarify the relationship between various dimensions in the pattern of one or more embodiments. Although C is substantially equal to $$\left(\frac{\sqrt{2}}{2}\right)A$$

in FIGS. 3A and 3B, Y can be any real number greater than zero, including the minimum feature size formable using known lithographic techniques, and does not necessarily bear any relationship to the width A of the pillars 121 after step 12.

Selectively definable layers 120 having a pattern of these dimensions can produce a pattern of spacer-defined holes in later steps that is advantageously aligned with the pattern of pillars 121 in the selectively definable layer 120. In particular, the pattern of the selectively definable layer 120 shown in FIG. 3A can be described as a set of pillars 121 formed in columns and rows, in which the leftmost pillar 121a is positioned in a first column and a second row, the uppermost pillar 121b is positioned in the second column and the first row, the lowermost pillar 121d is positioned in the second column and a third row, and the rightmost pillar 121c is positioned in the third column and the second row. When the mask pattern is formed using the dimensions described above, the holes formed in later steps can advantageously be positioned in open positions in the same columns and rows, such that the pattern of holes is aligned with the pattern of pillars. FIG. 8A, described more fully below, shows a pattern of holes 140 with a hole 140a positioned in the first column and the first row, another hole 140d positioned in the first column and the third row, another hole 140c positioned in the second column and the second row, another hole 140b positioned in the third column and the first row, and another hole 140e positioned in the third column and the third row.

In step 16 of FIG. 1B, the pattern of pillars 121 of the selectively definable layer 120 is transferred to the second hard mask layer 112, such as by anisotropically etching the second hard mask layer 112 through the selectively definable layer 120.

FIGS. 4A and 4B illustrate the partially formed integrated circuit 200 after step 20 of FIG. 1B has been carried out. In step 20, pillars 122 are formed in the first hard mask layer 110 by anisotropically etching the first hard mask layer 110 through the selectively definable layer 120 and the second hard mask layer 112. As shown in FIGS. 4A and 4B, the pillars 122 formed in step 20 can have substantially the same pattern as the pattern in the selectively definable layer 120. The selectively definable layer 120 can be removed during or after the etching step 20. In embodiments including the second hard mask layer 112, the second hard mask layer 112 may be removed in step 22, such as by carrying out a wet strip etch. In other embodiments, the selectively definable layer 120 is removed by the same etch used to define pillars 122 in the first hard mask layer 110. FIGS. 5A and 5B illustrate the partially formed integrated circuit 200 after removing the selectively definable layer 120.

In step 30 of FIG. 1B, spacer material 130 (FIGS. 6A, 6B) is deposited on the pillars 122. FIGS. 6A and 6B illustrate the partially formed integrated circuit 200 while step 30 of FIG. 1B is being carried out. The spacer material can include an insulating material, such as an oxide, e.g., silicon oxide, particularly a material that is selectively etchable with respect to the material of the pillars 122 and other exposed surfaces. Examples of other spacer materials include silicon nitride, $Al_2O_3$, TiN, etc. In one or more embodiments, depositing step 30 includes uniformly depositing spacer material 130 on the pillars 122 and the substrate 100, such as by blanket depositing the spacer material 130 by chemical vapor deposition.

FIGS. 6A and 6B show that as spacer material 130 is deposited on the pillars 122, the spacer material 130 fills a space between neighboring pillars 122 when the spacer material 130 forms a layer having a thickness F. In one or more embodiments, the thickness F is substantially equal to $$\left(1-\left(\frac{\sqrt{2}}{4}\right)\right)Y.$$

Preferably, spacer material 130 continues to be deposited beyond filling the space between the nearest neighboring pillars 122, such that the spacer material 130 surrounding the nearest neighboring pillars 122 converge and form voids with substantially circular cross-sections. Advantageously, due to corners having a relatively higher surface area for interacting with precursors, it has been found that the rate of deposition at the corners formed by the convergence is greater than at other parts between the pillars 122, causing the corners of the open space between the pillars 122 to become rounded.

Figure 7B:
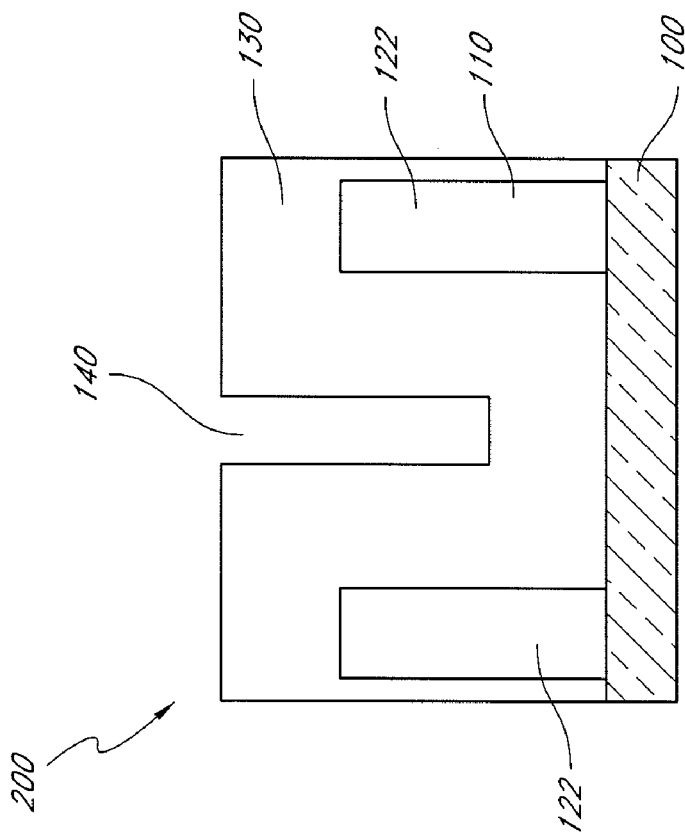
FIG. 7B illustrates a cross-sectional side view of the partially formed integrated circuit of FIG. 7A along the sectional line 7B shown in FIG. 7A.
Figure 7A:
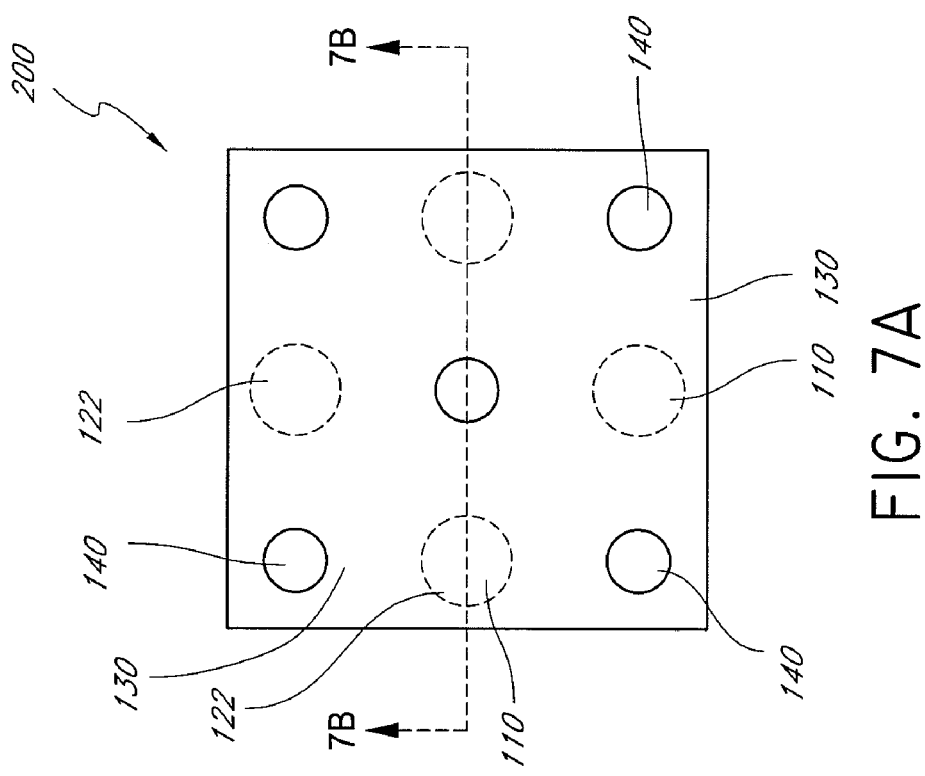
FIG. 7A illustrates a top view of the partially formed integrated circuit of FIG. 6A after deposition of the spacer material in accordance with one or more embodiments of the invention.

FIGS. 7A and 7B illustrate the partially formed integrated circuit 200 after depositing step 30 has been carried out. As shown in FIGS. 7A and 7B, sufficient spacer material 130 has been deposited to form holes 140 with a substantially circular cross-section. The holes 140 occur in a pattern that is aligned with the pattern of the pillars 122, as described above, and the density of the holes is greater than the density of the pillars 122 in the illustrated portion of the partially formed integrated circuit.

In order to achieve a rounded cross-section for the holes 140, it may be necessary to deposit so much spacer material 130 that the width of the holes 140 is smaller than the width C of the pillars. In step 32 of FIG. 1B, the spacer material 130 can be trimmed, such as by isotropically etching to uniformly expand the width of the holes 140. FIGS. 8A and 8B illustrate the partially formed integrated circuit 200 after step 32 of FIG. 1B has been carried out. As shown in FIG. 8B, after any etching to expand the holes 140, the layer of the spacer material 130 has a thickness G and the holes 140 have been expanded to form holes 141 having a width H. In one or more embodiments, the width H and the thickness G are both substantially equal to the width C of the pillars 122, advantageously providing a pattern of holes 141 and pillars 122 of substantially the same size. Steps 30 and 32 of FIG. 1B can be repeated as desired in order to achieve holes 141 of the desired shapes and sizes.

Figure 9B:
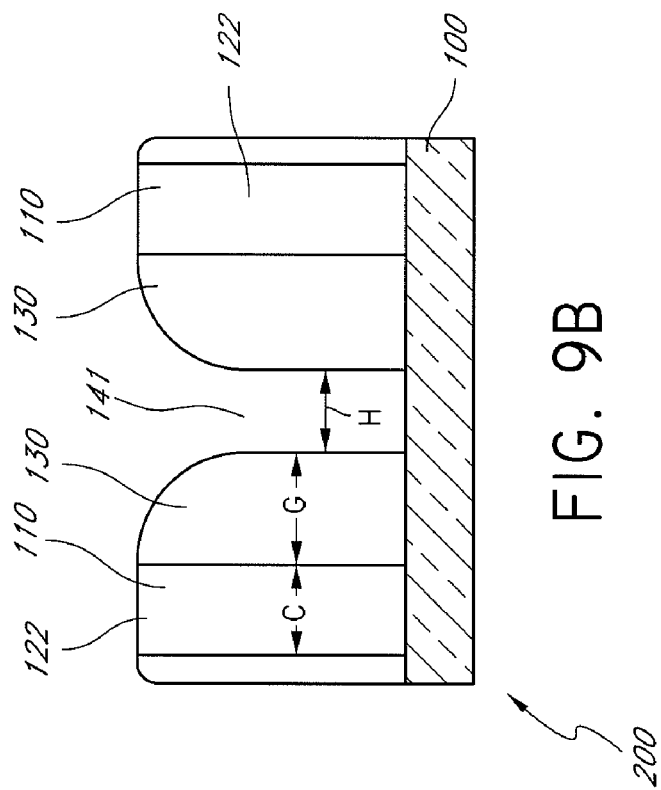
FIG. 9B illustrates a cross-sectional side view of the partially formed integrated circuit of FIG. 9A along the sectional line 9B shown in FIG. 9A.
Figure 9A:
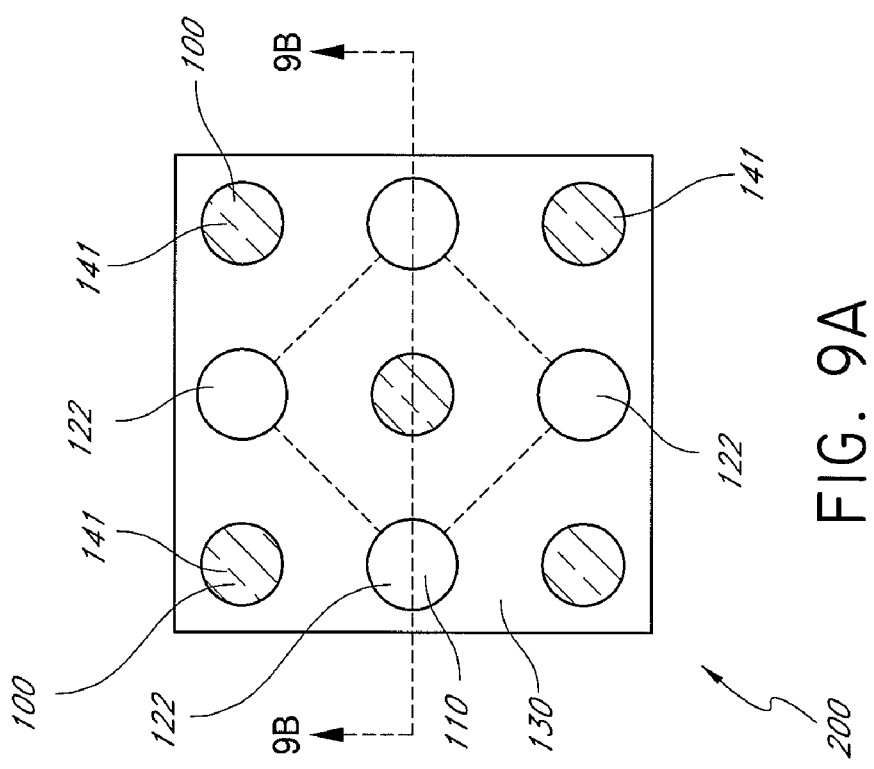
FIG. 9A illustrates a top view of the partially formed integrated circuit of FIG. 8A after further etching the spacer material in accordance with one or more embodiments of the invention.

In step 34 of FIG. 1B, spacer material 130 (FIGS. 9A, 9B) is anisotropically etched to expose the upper surfaces of the pillars 122 and the substrate 100. FIGS. 9A and 9B illustrate the partially formed integrated circuit 200 after step 34 of FIG. 1B has been carried out. The width H of the holes 141 and the thickness G of the spacer material 130 between the holes 141 and the pillars 122 remain substantially the same as before step 34. In some embodiments, the order of steps 32 and 34 can be reversed, such that the spacer material 130 is anisotropically etched before being trimmed by, e.g., an isotropic etch. In such embodiments, holes having different widths may be formed.

In step 40 of FIG. 1B, the pillars 122 (FIGS. 9A, 9B) are etched, such as by selectively etching the first hard mask layer 110 relative to the spacer material 130 to remove the pillars 122. FIGS. 10A and 10B illustrate the partially formed integrated circuit 200 after step 40 of FIG. 1B has been carried out. At this stage, a pattern of holes 141 has been achieved that has a density greater than or equal to about twice the density of the features that were formed in the selectively definable layer 120. Moreover, the holes 141 have a smaller feature size than the pillars 121 first formed by photolithography in the selectively definable layer 120, and the holes 141 occur in a pattern that is aligned with the pattern of pillars 121 in the selectively definable layer 120.

Figure 11B:
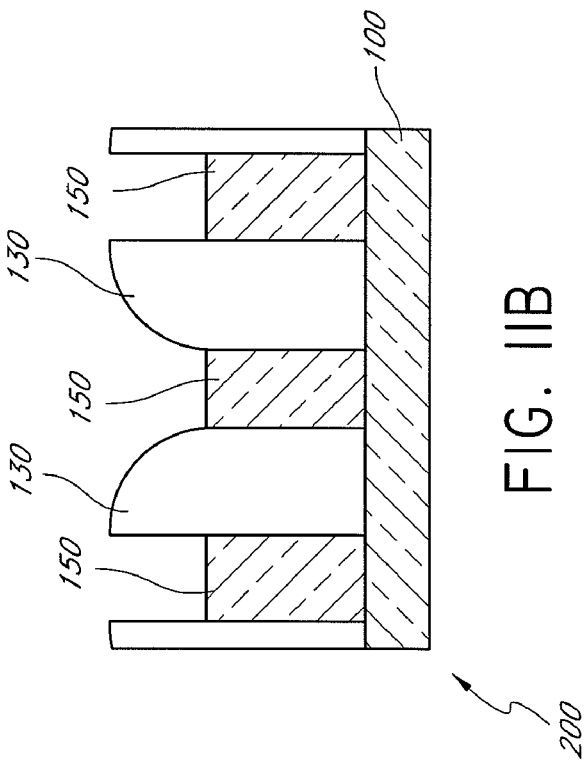
FIG. 11B illustrates a cross-sectional side view of the partially formed integrated circuit of FIG. 11A along the sectional line 11B shown in FIG. 11A.
Figure 11A:
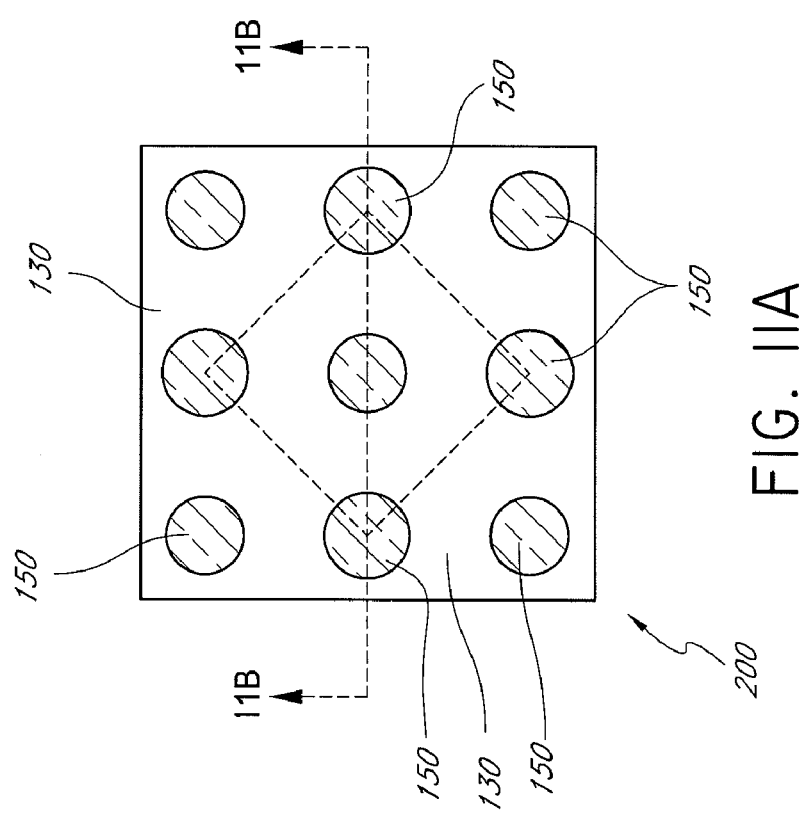
FIG. 11A illustrates a top view of the partially formed integrated circuit of FIG. 10A after forming plugs in accordance with one or more embodiments of the invention.

In step 50 of FIG. 1B, plugs 150 (FIGS. 11A, 11B) are formed in the holes 141. FIGS. 11A and 11B illustrate the partially formed integrated circuit 200 after step 50 of FIG. 1B has been carried out. Plugs 150 can be formed of the same material as the substrate 100. The spacer material 130 is chosen to be selectively etchable relative to the material forming the plugs 150. In one or more embodiments, the plugs 150 are formed of polysilicon and the spacer material 130 is formed of silicon oxide. Depositing step 50 can be carried out in accordance with well-known deposition processes, including but not limited to chemical vapor deposition (CVD), plasma enhanced chemical vapor deposition (PECVD), or spin coating. In some embodiments, plugs 150 (FIGS. 11A and 11B) can be formed by epitaxial growth.

In step 60, the spacer material 130 (FIGS. 11A, 11B) is removed, such as by selectively etching the spacer material 130. In processes using spin coating, CVD or PECVD in step 50 to deposit the plugs 150, it may be necessary to first planarize the surface, such as by a chemical mechanical polishing process, or perform a plug material etch back process in order to expose the spacer material 130.

FIGS. 12A and 12B illustrate the partially formed integrated circuit 200 after step 60 has been carried out. A pattern of plugs 150 has been formed on the substrate 100 with a density greater than or equal to about twice the density of the pillars that were formed on the selectively definable layer 120. Moreover, the plugs 150 have a smaller feature size than the pillars 121 first formed on the selectively definable layer 120, and the plugs 150 occur in a pattern that is aligned with the pattern of pillars 121 in the selectively definable layer 120.

While the method described above can provide a pattern of plugs with a density greater than or equal to about twice the density of the features that were formed on the selectively definable layer 120, the method may also be repeated to produce a pattern with a density of features that is greater than or equal to about four times the density of the original pattern. The method may then be repeated to achieve a pattern with a density of features that is greater than or equal to about eight times the density of the original pattern, and so on until the desired density is reached. For example, it will be appreciated that the plugs 150 or pillars patterned in the substrate 100, using the layer 130 (FIGS. 10A and 10B) as a mask, can be used as the pillars 122 in subsequent repeats of the method. For example, after forming these pillars steps 30-60 may be repeated. Thus, isolated features having a density $2^n$ can be formed, where n is the number of times the method of FIGS. 1A and 1B is repeated.

Many variations of the embodiments described herein are possible. For example, while the holes 141 and pillars 122 have the same size in the method described above, it may be desirable in some applications to form holes that are larger or smaller than the pillars. Accordingly, the thickness of the spacer material can be adjusted to achieve the desired result.

Additionally, while the method described above provides pillars and holes with a generally circular cross section, other shapes are also possible. For example, the pillars and holes can have a cross section that is generally in the shape of a square, a rectangle, or an ellipse.

Further, while the method described above provides holes 140 in a pattern that is aligned with the pattern of the pillars 122, it is also possible to place the holes in other locations relative to the pillars by beginning with a pattern of pillars other than the one described above, for example a pattern in which the centers of the pillars occur at the corners of a square. One example of another pattern that can be used is a pattern of three pillars, which can be used to form a hole between the three pillars.

Moreover, the embodiments described above can be used to selectively create patterns with higher density in some regions of the integrated circuit but not in other regions. In regions where a new, higher density pattern is to be formed, features can be spaced apart at a distance sufficiently small that it can be filled by the thickness of the spacer material. In regions where a higher density pattern is not desired, features can be spaced apart at too great a distance to be filled by the spacer material and/or selectively a protective mask can be used to prevent transfer of a pattern formed by the spacer material to the substrate 110, or to prevent deposition in the same openings formed by the spacer material 130. In this way, a high density pattern can be selectively provided in some regions of the integrated circuit but not in others.

In addition, it will be appreciated the use of an imaging stack including photoresist, an ARC, and amorphous carbon can be advantageously be applied to facilitate deposition of the spacer material. Temperatures typically used for chemical vapor deposition of the spacer material may undesirably deform photoresist, thus, amorphous carbon is used to form the pillars upon which the spacer material is deposited. In other embodiments where low temperature deposition processes (e.g., atomic layer deposition) are used to deposit the spacer material, the ARC and amorphous carbon layers may be omitted and the spacer material can be deposited on pillars formed of photoresist.

In accordance with the embodiments described above, a method is provided. Such a method might include, for example, providing a substrate and forming a first set of pillars on the substrate. The method can further include depositing spacer material on the first set of pillars to form a first pattern of holes, wherein at least one of the holes is located between pillars of the first set and wherein, after depositing, spacer material fills a space between a first pillar of the first set and a nearest neighboring pillar of the first set.

In other embodiments, a method is provided. The method can include providing a substrate and forming a plurality of pillars on the substrate, the pillars having a density X. The method can further include blanket depositing material on the pillars to form a pattern of holes on a level of the pillars, the holes having a density at least X.

In other embodiments, a method is provided. The method can include providing a substrate and forming a set of pillars on the substrate, wherein the pillars have a width of about $$\left(\frac{\sqrt{2}}{2}\right)Y,$$

and wherein a first pillar is separated from a second pillar by a distance of about $$\left(2-\left(\frac{\sqrt{2}}{2}\right)\right)Y,$$

and wherein the first pillar is separated from a third pillar by a distance of about $$\left(\frac{3\sqrt{2}}{2}\right)Y.$$

The method can further include depositing material on the set of pillars. The method can further include etching the material to form a pattern of holes, wherein the pattern comprises a hole between the first pillar and the third pillar.

In other embodiments, a method is provided. The method can include providing a set of pillars on a substrate, the pillars arranged in two or more rows and two or more columns. The method can further include blanket depositing spacer material on the set of pillars to form a pattern of holes adjacent the pillars. The method can further include isotropically etching the spacer material to enlarge the width of the holes. The method can further include anisotropically etching the spacer material to expose the pillars.

It will be appreciated by those skilled in the art that various other omissions, additions, and modifications may be made to the methods and structures described above without departing from the scope of the invention. All such changes are intended to fall within the scope of the invention, as defined by the appended claims.

What is claimed is:

1. A method comprising:
providing a substrate;
forming a first set of pillars on the substrate; and
depositing spacer material on the first set of pillars to form a first pattern of holes, at least one of the holes being laterally bounded on all sides, wherein the at least one of the holes is located between pillars of the first set, and wherein, after depositing, spacer material fills a space between a first pillar of the first set and a nearest neighboring pillar of the first set.

2. The method of claim 1, wherein the first set of pillars comprises at least one column and at least one row, the at least one column being oriented transverse to the at least one row, each of the at least one column and the at least one row comprising a plurality of pillars.

3. The method of claim 2, wherein the first pattern of holes comprises at least three columns and at least three rows.

4. The method of claim 1, wherein the first set of pillars comprises pillars having a generally circular cross section.

5. The method of claim 1, wherein the first pattern of holes comprises holes having a generally circular cross section.

6. The method of claim 1, wherein the spacer material is an insulating material.

7. The method of claim 1, wherein the spacer material is a semiconducting material or a conducting material.

8. The method of claim 1, further comprising, after depositing the spacer material, isotropically etching the spacer material to increase a width of the holes.

9. The method of claim 8, wherein, after isotropically etching, the width of the holes is between about 50% and about 150% of a width of the pillars.

10. The method of claim 1, further comprising, after depositing the spacer material, anisotropically etching the spacer material to expose the pillars of the first set.

11. The method of claim 10, further comprising, after exposing the pillars of the first set, selectively etching the first set of pillars to form a second pattern of holes, the second pattern of holes comprising the holes of the first pattern of holes and the holes created by selectively etching the first set of pillars.

12. The method of claim 11, further comprising forming a second set of pillars by depositing pillars into the second pattern of holes.

13. A method comprising:
providing a substrate;
forming a first set of pillars on the substrate, the forming a first set of pillars comprising:
forming a first hard mask layer over the substrate;
forming a selectively definable layer over the first hard mask layer, the selectively definable layer comprising a pattern of pillars;
trimming the pillars of the selectively definable layer; and
etching the first hard mask layer through the selectively definable layer to transfer the pattern of trimmed pillars to the first hard mask layer; and
depositing spacer material on the first set of pillars to form a first pattern of holes, wherein at least one of the holes is located between pillars of the first set, and wherein, after depositing, spacer material fills a space between a first pillar of the first set and a nearest neighboring pillar of the first set.

14. The method of claim 13, wherein trimming the pillars of the selectively definable layer comprises wet etching the selectively definable layer.

15. The method of claim 13, further comprising:
forming a second hard mask layer over the first hard mask layer before forming the selectively definable layer, wherein the selectively definable layer is formed over the second hard mask layer; and
etching the second hard mask layer through the selectively definable layer before etching the first hard mask layer.

16. A method comprising:
providing a substrate;
forming a plurality of pillars on the substrate, the pillars having a density X; and
blanket depositing material on the pillars to form a pattern of holes on a level of the pillars, at least one of the holes being laterally bounded on all sides, the holes having a density at least X, wherein X is a real number greater than zero.

17. The method of claim 16, wherein forming the plurality of pillars comprises forming pillars having a generally circular cross section.

18. The method of claim 16, wherein the plurality of pillars comprise transparent carbon.

19. The method of claim 16, wherein forming the plurality of pillars comprises etching the pillars using a mask.

20. The method of claim 19, wherein the mask is formed of a photoresist.

21. The method of claim 16, wherein the holes of the pattern have a generally circular cross section.

22. The method of claim 16, further comprising removing the plurality of pillars to form a pattern of holes of density at least 2X.

23. The method of claim 22, further comprising forming plugs in the pattern of holes of density at least 2X.

24. The method of claim 23, wherein forming plugs comprises epitaxially depositing plugs on the substrate inside the holes.

25. A method comprising:
providing a substrate;
forming a set of pillars on the substrate, wherein the pillars have a width of about $$\left(\frac{\sqrt{2}}{2}\right)Y,$$

and wherein a first pillar is separated from a second pillar by a distance of about $$\left(2-\left(\frac{\sqrt{2}}{2}\right)\right)Y,$$

and wherein the first pillar is separated from a third pillar by a distance of about $$\left(\frac{3\sqrt{2}}{2}\right)Y;$$

and
depositing material on the set of pillars to form a pattern of holes, wherein the pattern comprises a hole between the first pillar and the third pillar, wherein Y is a real number greater than zero.

26. The method of claim 25, wherein forming a set of pillars comprises forming pillars having a generally circular cross section.

27. The method of claim 25, wherein depositing comprises filling a space between the first pillar and the second pillar.

28. The method of claim 25, wherein the pattern comprises holes having a generally circular cross section.

29. The method of claim 28, wherein the holes have a diameter of about $$\left(\frac{\sqrt{2}}{2}\right)Y.$$

30. A method comprising:
providing a set of pillars on a substrate, the pillars arranged in two or more rows and two or more columns;
blanket depositing spacer material on the set of pillars to form a pattern of holes adjacent the pillars, at least one of the holes being laterally bounded on all sides;
isotropically etching the spacer material to enlarge the width of the holes; and
anisotropically etching the spacer material to expose the pillars.

31. The method of claim 30, wherein the set of pillars has a density X and depositing spacer material forms a pattern of holes defined by the spacer material, wherein the holes have a density at least X and wherein X is a real number greater than zero.

32. The method of claim 31, further comprising selectively removing the pillars to form a pattern of holes having a density at least 2X.

33. The method of claim 30, wherein the pillars have a generally circular cross section.

34. The method of claim 30, wherein, after isotropically etching, the holes have a generally circular cross section.

35. The method of claim 30, wherein isotropically etching the spacer material is performed before anisotropically etching the spacer material.

* * * * *